United States Patent
Wong et al.

(10) Patent No.: US 6,372,150 B1
(45) Date of Patent: Apr. 16, 2002

(54) HIGH VAPOR PLASMA STRIP METHODS AND DEVICES TO ENHANCE THE REDUCTION OF ORGANIC RESIDUES OVER METAL SURFACES

(75) Inventors: Kaichiu Wong, Sunnyvale, CA (US); Gregory M. McMahon, St. Paul, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/215,093

(22) Filed: Dec. 18, 1998

(51) Int. Cl.[7] ................................................ H05K 3/26
(52) U.S. Cl. .............................. 216/13; 216/57; 216/67; 216/75; 134/1.1; 438/725
(58) Field of Search .......................... 134/1.1, 1.2, 1.3; 438/714, 725, 738, 935

(56) References Cited

U.S. PATENT DOCUMENTS

| | | | |
|---|---|---|---|
| 4,961,820 A | * 10/1990 | Shinagawa et al. | 156/643 |
| 5,007,983 A | * 4/1991 | Lerner et al. | 156/643 |
| 5,198,634 A | * 3/1993 | Mattson et al. | 219/121.43 |
| 5,567,271 A | * 10/1996 | Chu et al. | 156/659.11 |
| 5,674,357 A | * 10/1997 | Sun et al. | 156/659.11 |
| 5,693,147 A | * 12/1997 | Ward et al. | 134/1.1 |
| 5,755,891 A | * 5/1998 | Lo et al. | 134/1.2 |
| 5,773,201 A | * 6/1998 | Fujimura et al. | 430/329 |
| 5,925,577 A | * 7/1999 | Solis | 438/725 |

\* cited by examiner

*Primary Examiner*—Randy Gulakowski
*Assistant Examiner*—Allan Olsen
(74) *Attorney, Agent, or Firm*—Brinks Hofer Gilson & Lione

(57) ABSTRACT

Water vapor plasma etching of metal surfaces facilitates removal of organic residues over metal surfaces. By plasma etching metal surfaces covered with an organic material, such as photoresist, in an atmosphere in which the water vapor to $O_2$ ratio exceeds 5:3 (such as about 5:1, for example), superior organic material removal results are observed, particularly over relatively wide metal surfaces. The duration of the water vapor plasma etch also may be increased, relative to conventional organic material-removing processes. The effectiveness of the high vapor etch according to the present invention allows the elimination of a subsequent dry organic material stripping step, reducing processing time and cost while increasing yields.

20 Claims, 3 Drawing Sheets

HIGH VAPOR PLASMA STRIP METHODS AND DEVICES TO ENHANCE THE REDUCTION OF ORGANIC RESIDUES OVER METAL SURFACES

BACKGROUND OF THE INVENTION

1. Field of the Invention

This invention relates to the field of semiconductor manufacturing processes. In particular, the present invention relates to methods and devices to enhance the reduction of organic residues over metals surfaces.

2. Description of the Related Art

Metal layers, in integrated circuits, carry signals and power from one area of the circuit to another. To form a metal structure in an integrated circuit, a metal layer may be deposited on the surface of the wafer, followed by a layer of photoresist material. The photoresist is used to coat and photosensitize the underlying surface. After deposition, the photoresist is patterned to cause the non-imaged areas of the underlying layer to resist subsequent modifications, such as etching or metal evaporation. When the etching step, for example, is finished, the photoresist is removed.

FIG. 1 is a flowchart outlining steps to remove photoresist material from a metal layer after an etching step. As shown therein, step S0 is a metal etch step in which the metal layer exposed by the photoresist is etched, to form the desired metal structures, such as conductor lines, contact pads, buses etc. After the etching step S0, the wafer is subjected to a plasma etch removal of the photoresist, as shown in step S1.

The plasma etch step S1 of FIG. 1 may be further broken down into four steps, in which the oxygen ("$O_2$"), water ("$H_2O$") vapor, and pressure remain constant while the Radio Frequency ("RF") power within the plasma etch chamber and the position of the chuck or pedestal supporting the wafer within the plasma etch chamber varies from a lower position to an upper position. Table 1 outlines a process for plasma etching the photoresist and quantifies the aforementioned parameters.

TABLE 1

| Step | 1 | 2 | 3 | 4 |
|---|---|---|---|---|
| Pressure (milliTorr) | 1200 | 1200 | 1200 | 1200 |
| $O_2$ (sccm) | 180 | 180 | 180 | 180 |
| $H_2O$ (sccm) | 300 | 300 | 300 | 300 |
| Time (seconds) | 30 | 3 | Endpt., 45 | 15 |
| RF power (watts) | 0 | 0 | 1200 | 1200 |
| Chuck Position (Up, Down) | Down | Up | Up | Up |

As shown in Table 1, the $O_2$ to $H_2O$ mixture of step S1 of FIG. 1 is maintained at a 5:3 ratio (300 standard cubic centimeters per minute ("sccm") $H_2O$: 180 sccm $O_2$ at a pressure of 1200 milliTorr during all four steps. In a first step, lasting 30 seconds, the chuck is maintained at a lower position, further away from the plasma source, and the RF power is turned off. In a second step, lasting only 3 seconds, the same conditions prevail and the chuck is moved to an upper position, relatively closer to the source of plasma than the lower position thereof. In a third step, the same chuck position and $O_2$:$H_2O$ ratio are maintained and the RF power is turned on to 1200 watts for 45 seconds. The same parameters are then maintained in a fourth step, lasting 15 seconds.

In step S2 of FIG. 1, the metal layer, now etched, is then inspected to determine whether the photoresist has been properly removed from the surface of the metal layer. The photoresist is then subjected to a solvent strip to remove residual photoresist particulates from the metal layer as shown in step S3. The solvent strip of step S3 is then followed by a dry strip step S4, in an effort to remove any last remaining particulates or residual photoresist left after the solvent strip step shown at S3 in FIG. 1. After the dry strip of step S4, the metal surfaces are again inspected, as shown at step S5, to determine the efficacy of the preceding steps in removing the photoresist from the metal layer.

Despite these steps, however, some residual photoresist particulates may still be present on the metal layer, which particulates can lead to device failures and decrease the overall effective yield of the process. Such remaining photoresist particulates are schematically shown in FIG. 2. FIG. 2 shows a metal layer 100 comprising a wide area 110 and relatively narrower areas 130. For example, the wide area 110 of the metal layer 100 may be, for example, a power bus, a contact pad or some other wide metallic structure, whereas the relatively narrower areas 130, for example, represents thin conductor lines or some other narrow metal structure within an integrated circuit. It has been found that photoresist particulates, such as shown at reference numeral 120 in FIG. 2, tend to remain adhered to the wide area 110 of the metal layer 100, even after the etch and cleaning steps of FIG. 1. Indeed, while the steps shown in FIG. 1 are generally effective in removing the photoresist material from the relatively narrower areas 130 of metal layers, such as metal layer 100 of FIG. 2, the cleaning steps of FIG. 1 are somewhat less effective in removing residual photoresist over wide metal areas, such as shown at 110 in FIG. 2. Such residual photoresist on wide metal surfaces leads to increased defect count per wafer and decreases the yield of the process.

What are needed, therefore, are methods and devices to enhance the reduction of organic material residues (such as photoresist residues) over metal surfaces. In particular, what are needed are methods and devices to enhance the reduction of photoresist and other organic residues over wide metal surfaces.

SUMMARY OF THE INVENTION

An object of the present invention, therefore, is to provide methods and devices to enhance the reduction of photoresist and other organic residues over wide metal surfaces.

In accordance with the above-described objects and those that will be mentioned and will become apparent below, a method of removing organic residue from a metal surface, according to an embodiment of the present invention, comprises the steps of:

etching the metal surface with a plasma comprising $H_2O$ and an oxygen source ($O_2$), where a volume, flow rate or molar ratio of $H_2O$:$O_2$ source exceeds 5:3; and stripping the metal surface with a solvent to remove remaining organic residue from the metal surface.

According to other embodiments, the ratio of $H_2O$ vapor:$O_2$ source ratio exceeds 5:2 by flow rate, such as about 5:1 by flow rate. The RF power during the plasma etching step may be about 1200 watts. The plasma is in a chamber having a pressure of about 50 to about 10,000 milliTorr and preferably includes one or more (hydro)fluorocarbons, such as $CF_4$, $CHF_3$, $C_2F_6$, $C_2H_2F_4$ (e.g., Freon-134), c-$C_4F_8$, combinations thereof, or such other etchant gases as $NF_3$ and/or $SiF_4$. Preferably, the water vapor etching step of the present invention is carried out for a period of time of at least about 60 seconds. For example, the present etching step may be carried out for a period of time ranging from about 60 seconds to about 120 seconds, such as for a period of time ranging from about 70 seconds to about 90 seconds. The organic residue may include photoresist.

The present invention may also be viewed as a device to remove organic residue from a metal surface, comprising:

a plasma etching chamber;

a pedestal for supporting the substrate, the pedestal being mounted within said plasma etching chamber, and at least one gas inlet into the plasma etching chamber for introducing at least a source of $H_2O$ vapor and source of $O_2$ into the chamber at an $H_2O:O_2$ ratio by volume and/or flow ratio (unit volume per unit time) or moles exceeding 5:3. According to a further embodiment, the $H_2O:O_2$ vol./flow ratio is about 5:1.

The present invention is also a semiconductor device having at least one constituent metal layer processed by a method comprising the steps of:

forming first and second metal structures from the at least one constituent metal layer, the at least one constituent metal layer having a layer organic material thereon; and etching the layer of organic material with a plasma having a ratio of $H_2O$ vapor to $O_2$ of greater than 5:3 by volume, flow rate or moles.

According to further embodiments, the method may further comprise stripping residual organic material with a solvent after the etching step. The ratio of $H_2O$ vapor to $O_2$ may be at least about 5:2. The organic material may include a photoresist. The metal layer may include at least one metal selected from the group consisting of Al, Cu, refractory metals, alloys, nitrides and silicides thereof The metal layer may comprise at least one member of the group consisting of Al, Cu, Ti, Ta, W, and alloys thereof.

BRIEF DESCRIPTION OF THE DRAWINGS

For a further understanding of the objects and advantages of the present invention, reference should be made to the following detailed description, taken in conjunction with the accompanying figures, in which.

DESCRIPTION OF THE PREFERRED EMBODIMENTS

Figure 3:
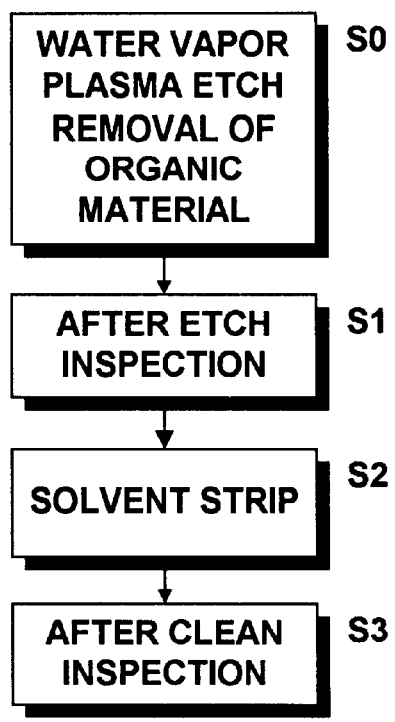
FIG. 3 is a flowchart of a method of enhancing the reduction of organic residues over metal surfaces, according to an embodiment of the present invention.

FIG. 3 shows an embodiment of a method of enhancing the reduction of organic residue over metal layers, according to the present invention. Herein, the phrase "metal layer" refers to a layer of metal formed (deposited, for example) on a substrate, without regard to the relative magnitudes of the dimensions of the metal formation (i.e., the term "metal layer" is not intended to be restricted by the connotation associated with the word "layer"). Such metal layers (including for example, Al, Cu and/or refractory metals [such as Ti, W, Ta, alloys thereof and nitrides thereof] and/or alloys and silicides thereof) may be patterned (etched, for example) to form vias, contact pads, power and signal busses, local interconnects and the like on the semiconductor wafer to form structures on and/or within semiconductor devices. According to the present invention, after a conventional metal etch step (not shown), a water ($H_2O$) vapor plasma etch step is carried out, to remove the layer of organic material (such as photoresist) from the metal layer, as shown in step S0.

Figure 2:
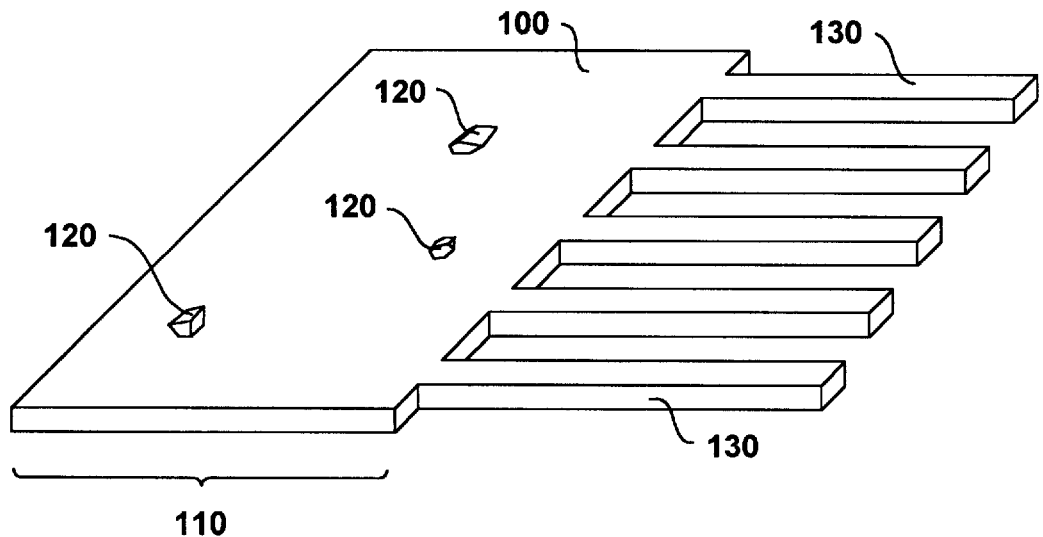
FIG. 2 is a representation of a metal layer and unwanted photoresist particulate matter thereon.

However, such water vapor plasma etches benefit from the addition of a source of oxygen, such as $O_2$, $O_3$, $CO_2$, $H_2O_2$, etc. According to the present invention, the ratio of $H_2O$ vapor to $O_2$ exceeds 5:3 by moles, volume or flow rate (unit vol./unit time), preferably by flow rate. Assuming the etchant gas behaves ideally, these bases for the $H_2O:O_2$ ratio are equivalent. Preferably, the flow rate ratio of $H_2O$ to $O_2$ is at least about 5:2, but is less than or equal to about 20:1, and more preferably is about 5:1. Alternatively, the water vapor may be created in situ by the reaction of $H_2$ and $O_2$, or decomposition of $H_2O_2$, but for safety reasons, these alternatives are not preferred. After the water vapor plasma etch step S0, the etched metal layer may be inspected, as shown in step S1. Step 1 is optional, and may be omitted. A solvent strip is then carried out, as shown in step S2, to remove any residual organic material (such as photoresist) from the metal layer, such as organic residue 120 on metal surface 100 in FIG. 2. Another inspection step may then be carried out to inspect the metal surface, as shown in step S3.

Figure 4:
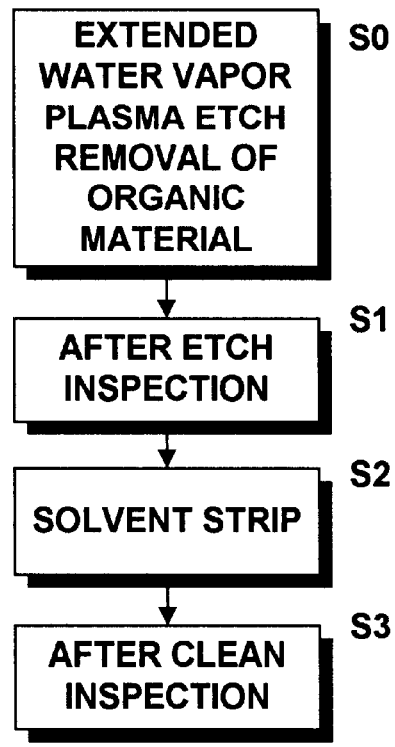
FIG. 4 is a flowchart of a method of enhancing the reduction of organic residues over metal surfaces, according to another embodiment of the present invention.

FIG. 4 shows another embodiment of the present invention. As shown therein, the water vapor plasma etch step is carried out for an extended period of time, as compared to the process shown in FIG. 1. For example, the water vapor plasma etch step S0 of FIG. 4 may be carried out for a period of time ranging from about 60 seconds to about 120 seconds. Preferably, the extended water vapor etching step S0 of FIG. 4 is carried out for a period of time ranging between about 70 seconds to about 90 seconds and more preferably between about 75 and about 80 seconds at an RF power of about 1200 watts. Different RF powers may, according to the present invention, necessitate corresponding variations in the duration of the water vapor plasma etching step S0 of FIG. 4. Steps S1 through S3 of FIG. 4 are similar to steps S1 through S3 of FIG. 3, respectively, and the corresponding disclosure thereof is incorporated herewith.

According to an embodiment of the present invention, the water vapor plasma etching step (steps S0 of FIGS. 3 and 4) may be carried out in an atmosphere at a pressure of, for example, 1200 milliTorr, although other pressures may be freely chosen. Other pressures, however, may require corresponding changes in the RF power and/or the duration of the water vapor etching step. The atmosphere in which the water vapor etching step according to the present invention is carried out may include other process gases, such as inert gases (argon, nitrogen, or helium, for example) as well as other etchant gases ([hydro]fluorocarbons such as $CF_4$, $CHF_3$, $C_2F_6$, $C_2H_2F_4$, c-$C_4F_8$ and/or $NF_3$, $SiF_4$, for example). Table 2 summarizes the aforementioned parameters of the water vapor plasma etching step according to the present invention.

TABLE 2

| Step | 1 | 2 | 3 | 4 |
|---|---|---|---|---|
| Pressure (milliTorr) | 1200 | 1200 | 1200 | 1200 |
| $O_2$ (sccm) | 100 | 100 | 100 | 100 |
| $H_2O$ (sccm) | 500 | 500 | 500 | 500 |
| Time (seconds) | 30 | 3 | Endpt., 60 | 30 |

TABLE 2-continued

| Step | 1 | 2 | 3 | 4 |
|---|---|---|---|---|
| RF power (watts) | 0 | 0 | 1200 | 1200 |
| Chuck Position (Up, Down) | Down | Up | Up | Up |

As shown in Table 2, the $O_2$ to $H_2O$ mixture may be maintained at a 5:1 ratio (500 sccm $H_2O$:100 sccm $O_2$, for example) at a pressure of, for example, from 50 to 10,000 milliTorr, preferably from 200 to 6,000 milliTorr, more preferably 800 to 2,000 milliTorr (and in a specific example, about 1200 milliTorr) during all four steps. In a first step, which may last about 30 seconds, the chuck (e.g., pedestal within the plasma chamber) may be maintained in a lower position, further away from the plasma source, and the RF power may be turned off. In a second step, which may last about 3 seconds, the same conditions may be maintained and the chuck may be moved to an upper position, relatively closer to the source of plasma than the lower position thereof In a third step, the same chuck position and increased $O_2$:$H_2O$ ratio are maintained and the RF power is turned on to, for example, about 1200 watts for about 60 seconds, for example. The same parameters may then maintained in a fourth step, which may last about 30 seconds.

Figure 1:
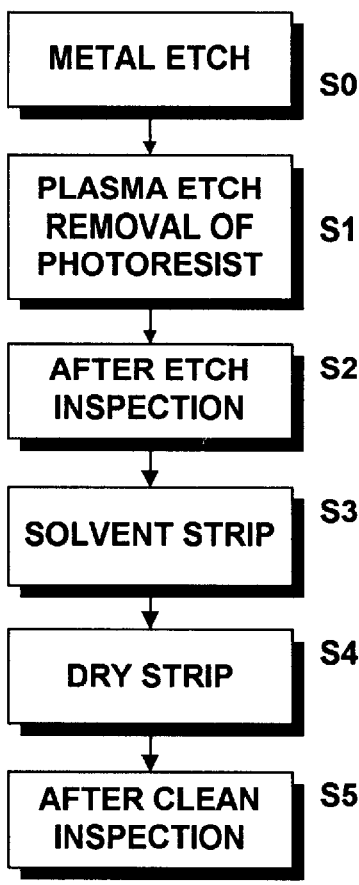
FIG. 1 is a block diagram of a method to etch and to clean a metal layer of unwanted photoresist.

According to the present invention, the organic material etch time may be increased by about 15 to about 20 seconds per wafer, as compared to the processes outlined in FIG. 1 and Table 1. However, as the water vapor plasma etching step, in combination with the subsequent solvent strip (shown at S2 in FIGS. 3 and 4), is highly effective in removing organic materials from metal surfaces, a dry strip step (such as shown at S4 in FIG. 1) is no longer necessary, saving both a process step and process time. As the dry strip step shown at S4 in FIG. 1 lasts about 1 minute per wafer, implementation of the present invention saves about 40–45 seconds processing time per wafer while achieving superior organic material removal results over (relatively wide) metal surfaces.

The present invention may also be viewed as a semiconductor device in which at least one of the constituent metal layers thereof is processed according to the steps explained above and illustrated in FIGS. 3 and 4.

The present invention enjoys particular advantages when used to process a metal layer having a feature or structure at least 2×, preferably at least 3× and more preferably 4× the minimum feature width of the metal layer (as determined by the design rules for the device or technology containing the metal layer). Such features and/or structures included busses, contacts, "landing pads" for contacts, and input/output (bonding) pads.

Figure 5:
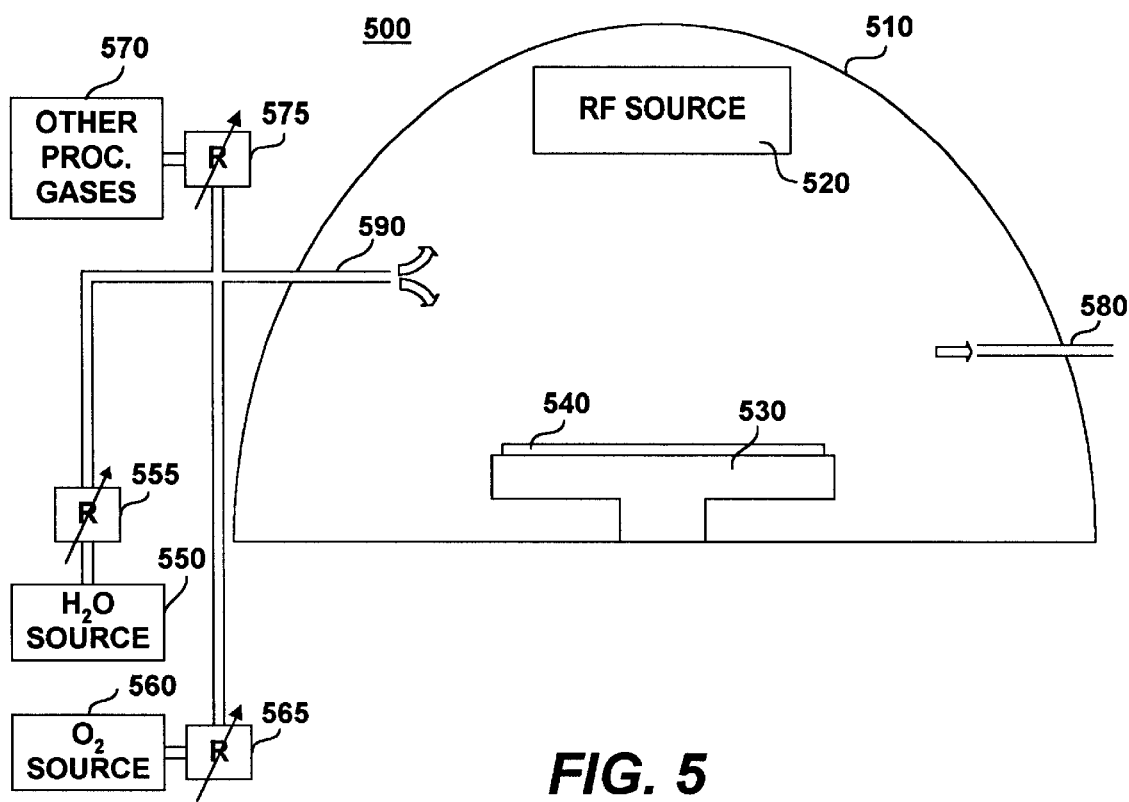
FIG. 5 is a block diagram of a device to enhance the reduction of organic residues over metal surfaces, according to an embodiment of the present invention.

Alternatively, the present invention may also be viewed as a device to remove organic residue, such as photoresist, from a metal layer on a substrate. An embodiment of such a device is shown in FIG. 5. As shown therein, the device 500 includes a plasma etching chamber 510, a chuck (pedestal) 530 for supporting a substrate such as a semiconductor wafer 540, the chuck 530 being mounted within the plasma etch chamber 510. An RF power source 520 is present within the plasma etch chamber 510. One or more gas inlets 590 are configured to deliver process gases into the plasma etching chamber 510. One or more gas outlets 580 may also be adapted to controllably evacuate the process gases from the chamber 510 and/or to maintain a desired pressure within the chamber 510. Process gases may also be delivered (not shown) to the backside of the wafer through the chuck 530, to regulate heat transfer between the semiconductor wafer 540 and the pedestal 530. The device may include a plurality of gas reservoirs and gas flow regulators to introduce the process gases into the plasma etching chamber 510. For example, the device 500 may include a water vapor source 550 in fluid communication with a regulator 555 to regulate the amount of water vapor introduced into the chamber 510. Likewise, the device 500 may include a source of $O_2$ gas 560, together with a corresponding regulator 565 to regulate the amount of $O_2$ gas introduced into the chamber 510. As shown at 570, the device 500 may also include one or more sources of other process gases, including inert gases and/or etchant gasses and a corresponding number of regulators 575 in fluid communication therewith. For example, inert gasses such as argon, helium and/or nitrogen and/or etchant gasses such as $CF_4$, $CHF_3$, $C_2F_6$, $NF_3$ and/or $SiF_4$, for example, may also be introduced into the chamber 510 via the regulator(s) 575 and the inlet or inlets 590.

According to the present invention, the regulators 555 and 565 are configured to deliver water vapor and $O_2$ at a ratio exceeding 5:3. Preferably, water vapor and $O_2$ are introduced into the chamber 510 at a ratio exceeding about 5:2 and more preferably at a ratio of about 5:1. For example, $H_2O$ vapor may be introduced into the plasma etching chamber 510 at a flow rate of about 500 sccm, whereas $O_2$ gas may be introduced into the chamber 510 at a flow rate of about 100 sccm.

Implementation of the (extended) water vapor plasma etch process to remove organics from metal surfaces according to the present invention has shown to be highly effective in removing organic materials from wide metal surfaces without, however substantially affecting narrower metal features. This result may be quantified, for example, by using an optical wafer surface inspection tool, such as the KLA-Tencor 2132 or 2138, commercially available from KLA-Tencor Corporation of San Jose, Calif., or such a tool as the WF-700 Series Wafer Defect Inspection System commercially available from Applied Materials of Santa Clara, Calif. Using a water vapor plasma etch according to the present invention, a defect reduction per wafer of about 25% was observed using such wafer inspection devices, as compared to other processes, such as shown in FIG. 1. In one experiment involving two lots of wafers, the total yield of functional dies per wafer, following implementation of the water vapor extended etch of the present invention, increased by about 30 die per wafer ("dpw"), whereas virgin yield (full functionality upon first testing) increased by about 55 dpw, as compared to total and virgin yields of other processes (such as obtained by implementing the process shown in FIG. 1), respectively.

While the foregoing detailed description has described preferred embodiments of the present invention, it is to be understood that the above description is illustrative only and not limiting of the disclosed invention. Indeed, various modifications of the present invention may occur to those of skill in this art, and all such modifications are deemed to fall within the scope of the present invention. Thus, the present invention to be limited only by the claims as set forth below.

What is claimed is:

1. A method of removing organic residue from a metal surface, comprising:

etching the metal surface with a plasma comprising $H_2O$ and an oxygen source ($O_2$), where a volume, flow rate or molar ratio of $H_2O$:$O_2$ source exceeds 5:3; and stripping the metal surface with a solvent to remove remaining organic residue from the metal surface;

wherein the plasma further includes at least one gas selected from the group consisting of (hydro)fluorocarbons, $NF_3$ and $SiF_4$, and the metal surface comprises a feature or structure at least two times the minimum feature width of the metal surface.

2. The method of claim 1, wherein the ratio of $H_2O$ vapor:$O_2$ source ratio exceeds 5:2 by flow rate.

3. The method of claim 1, wherein the $H_2O:O_2$ source ratio is about 5:1 by flow rate.

4. The method of claim 1, wherein an RF power during the plasma etching step is about 1,200 watts.

5. The method of claim 1, wherein said at least one gas is selected from the group consisting of $NF_3$, $CF_4$, $CHF_3$, $C_2F_6$, $C_2H_2F_4$, c-$C_4F_8$ and $SiF_4$.

6. The method of claim 1, wherein the plasma is in a chamber having a pressure from about 50 to about 10,000 milliTorr.

7. The method of claim 1, wherein the etching step is carried out for a period of time of at least about 60 seconds.

8. The method of claim 1, wherein the etching step is carried out for a period of time ranging from about 60 seconds to about 120 seconds.

9. The method of claim 1, wherein the etching step is carried out for a period of time ranging from about 70 seconds to about 90 seconds.

10. The method of claim 1, wherein the organic residue includes photoresist.

11. A method of removing organic residue from a metal surface, comprising:

etching the metal surface with a plasma prepared from a mixture comprising $H_2O$, an oxygen source ($O_2$), and another etchant gas; and stripping the metal surface with a solvent to remove remaining organic residue from the metal surface;

wherein a volume, flow rate or molar ratio of $H_2O:O_2$ source exceeds 5:3, and the metal surface comprises a feature or structure at least two times the minimum feature width of the metal surface.

12. The method of claim 11, wherein said another etchant gas is at least one gas selected from the group consisting of (hydro)fluorocarbons, $NF_3$ and $SiF_4$.

13. The method of claim 11, wherein said another etchant gas is at least one gas selected from the group consisting of $NF_3$, $CF_4$, $CHF_3$, $C_2F_6$, $C_2H_2F_4$, c-$C_4F_8$ and $SiF_4$.

14. The method of claim 11, wherein the ratio of $H_2O:O_2$ source exceeds 5:2.

15. The method of claim 11, wherein the plasma is in a chamber having a pressure from 50 to 10,000 milliTorr.

16. The method of claim 11, wherein the etching is carried out for a period of time of at least 60 seconds.

17. The method of claim 11, wherein the etching is carried out for a period of time of from 60 seconds to 120 seconds.

18. The method of claim 11, wherein the etching is carried out for a period of time of from 70 seconds to 90 seconds.

19. A method of making a semiconductor device, comprising:

removing organic residue from a metal surface by the method of claim 1, wherein said metal surface is on a surface of a wafer; and forming a semiconductor device from the metal surface and the wafer.

20. A method of making a semiconductor device, comprising:

removing organic residue from a metal surface by the method of claim 11, wherein said metal surface is on a surface of a wafer; and forming a semiconductor device from the metal surface and the wafer.

* * * * *